United States Patent

Kosaki

Patent Number: 5,441,629
Date of Patent: Aug. 15, 1995

[54] APPARATUS AND METHOD OF ELECTROPLATING

[75] Inventor: Katsuya Kosaki, Itami, Japan

[73] Assignee: Mitsubishi Denki Kabushiki Kaisha, Tokyo, Japan

[21] Appl. No.: 192,853

[22] Filed: Feb. 7, 1994

[30] Foreign Application Priority Data

Mar. 30, 1993 [JP] Japan .................. 5-071379

[51] Int. Cl.⁶ .............. C25D 5/08; C25D 5/48; C25D 17/00
[52] U.S. Cl. .................. 205/148; 205/205; 204/225; 204/269; 204/270; 204/274; 204/277; 204/278; 204/275
[58] Field of Search ............ 204/224 R, 275, 297 M, 204/225, 278, 277, 274, 269; 205/148, 205

[56] References Cited

U.S. PATENT DOCUMENTS

| | | | |
|---|---|---|---|
| 2,431,949 | 12/1947 | Martz | 205/148 X |
| 3,841,990 | 10/1974 | Sasaki et al. | 204/277 X |
| 4,007,097 | 2/1977 | Noz | 204/297 M |
| 4,192,729 | 3/1980 | Cancelleri et al. | 204/277 X |
| 4,339,319 | 7/1982 | Aigo | 204/224 |
| 4,441,976 | 4/1984 | Iemmi et al. | 205/148 X |
| 4,655,162 | 7/1987 | Kameyama | 118/50 |

FOREIGN PATENT DOCUMENTS

| | | |
|---|---|---|
| 0129108 | 12/1984 | European Pat. Off. . |
| 0180078 | 5/1986 | European Pat. Off. . |
| 4028897 | 1/1992 | European Pat. Off. . |
| 1406461 | 1/1963 | France . |
| 63-96292 | 4/1988 | Japan . |
| 194620 | 4/1989 | Japan . |
| 1294888 | 11/1989 | Japan . |
| 2310393 | 12/1990 | Japan . |
| 344023 | 2/1991 | Japan . |
| 385470 | 8/1991 | Japan . |
| 4395 | 1/1992 | Japan . |

Primary Examiner—Donald R. Valentine
Attorney, Agent, or Firm—Leydig, Voit & Mayer

[57] ABSTRACT

An electroplating apparatus includes a casing having a large opening at the bottom, a substrate being electroplated in the casing, a plating solution injector penetrating through an upper part of the casing for introducing a plating solution into the casing, an exhaust port penetrating through an upper part of the casing for draining the plating solution, a vertically movable substrate stage disposed beneath the casing for holding the substrate and having an opening smaller than the substrate, and a spin chuck for carrying the substrate to the substrate stage. In this apparatus, initially, the substrate is put on the spin chuck. Then, the substrate stage moves up and closes the casing from the bottom, and the substrate is electroplated in the casing. After the electroplating, the substrate stage moves down, and the substrate is transferred to the spin chuck. Automatic transfer of the substrate is possible using a uniaxial robot that moves only in the vertical or horizontal directions.

16 Claims, 17 Drawing Sheets

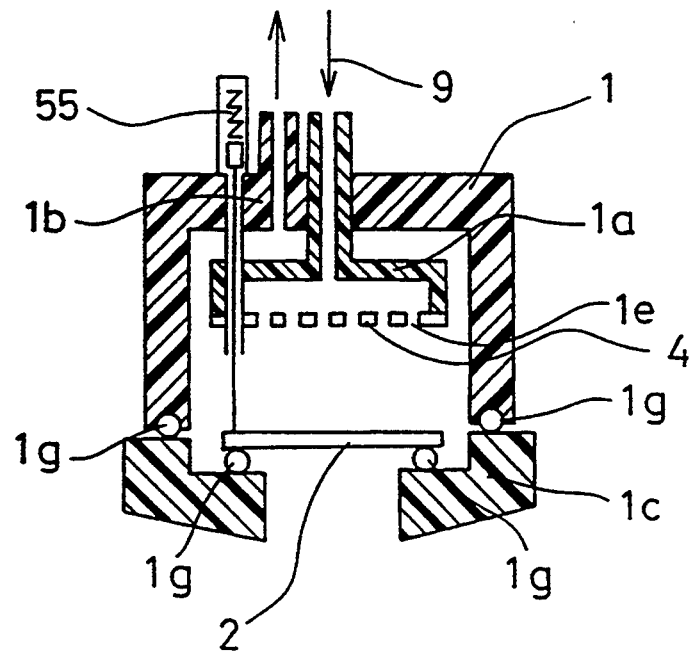
Fig. 1(a)
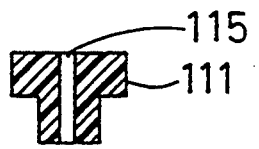
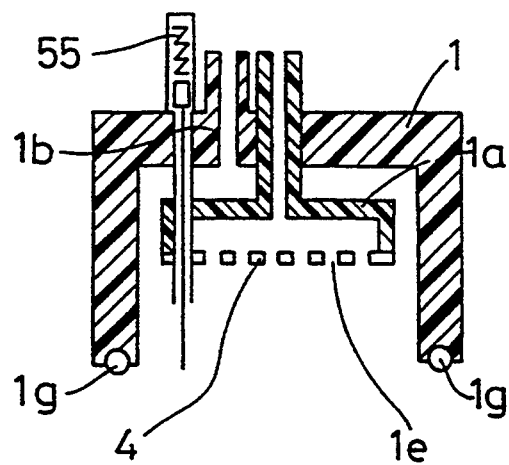
Fig. 1(b)
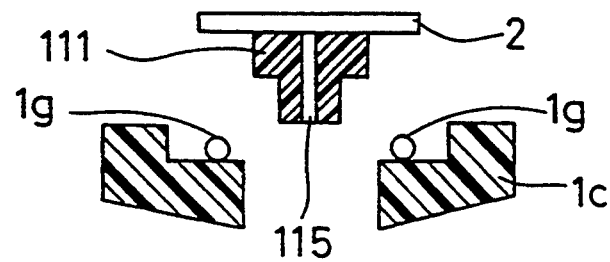

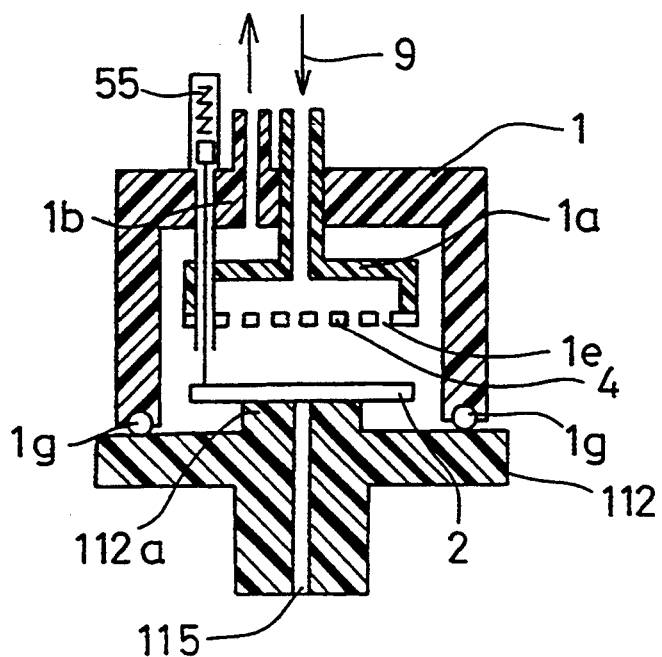
Fig.2(a)
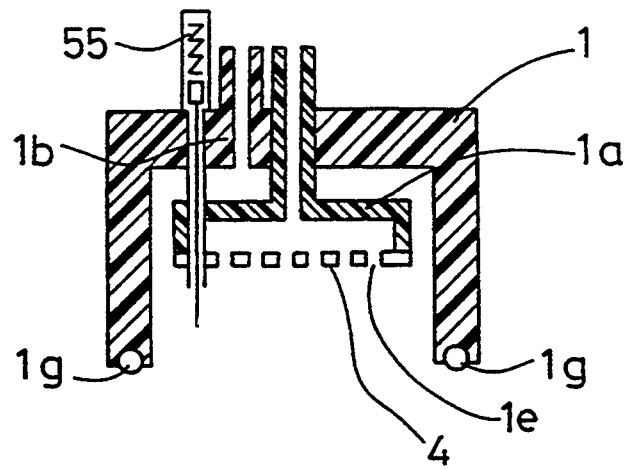
Fig.2(b)
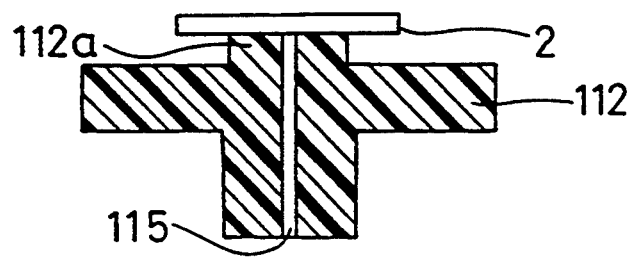

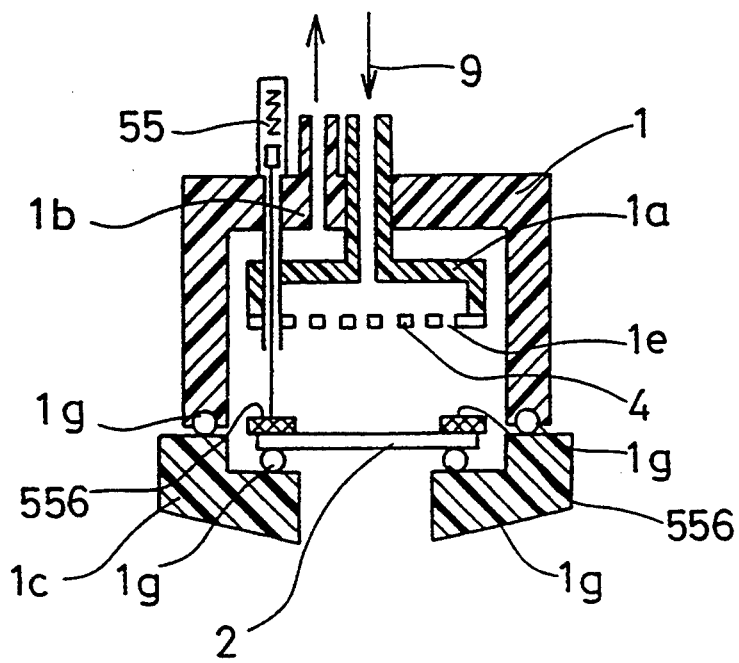
Fig.8(a)
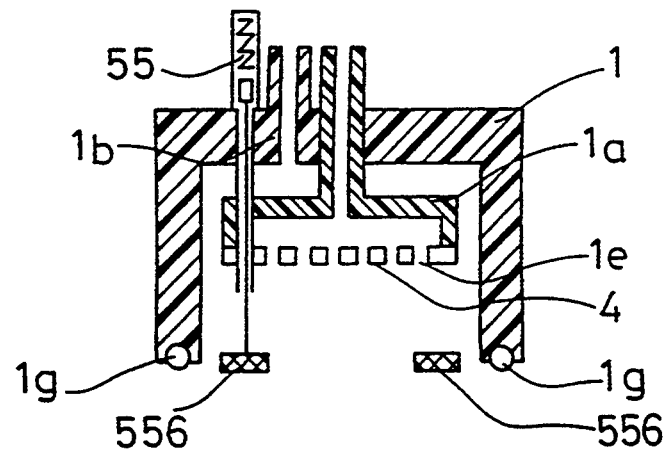
Fig.8(b)
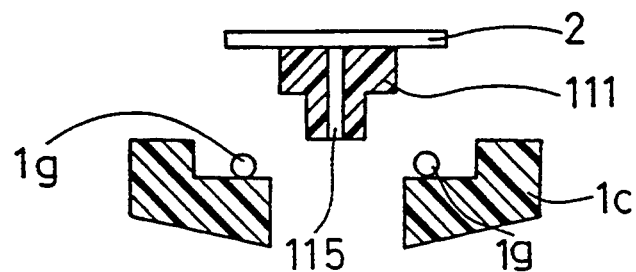

APPARATUS AND METHOD OF ELECTROPLATING

FIELD OF THE INVENTION

The present invention relates to an apparatus and a method for electroplating a metal layer on a surface of a substrate.

BACKGROUND OF THE INVENTION

FIG. 17 is a cross section of a prior art electroplating apparatus. In the figure, reference numeral 1 designates a cup in which a substrate 2 is processed, numeral 1a designates a plating solution inlet, numeral 1b designates a plating solution outlet, numeral 3 designates a power supply, numeral 4 designates an anode, numeral 5 designates a cathode contact pin contacting and holding the substrate 2, numeral 6 designates a plating bath comprising a resin, numeral 6a designates a drain of the plating bath 6, numeral 7 designates a plating solution storage tank, numeral 7a designates a heater for heating the plating solution in the storage tank 7, numeral 8 designates a pump for circulating the plating solution, numeral 9a designates the surface of the plating solution, numeral 11 designates oxygen in air, and numeral 12 designates Au particles. Arrows 9 show the flow of the plating solution. A dotted line 10 shows a leakage current flowing through the plating solution.

A description is given of the function and the operation.

The substrate 2 is disposed in the cup 1 so that the front surface on which a metal layer is to be formed by electroplating looks downward, and tips of at least three cathode contact pins 5 which are fixed to the cup 1 are in contact with the front surface of the substrate 2, whereby a negative electrode of the power supply 3 is electrically connected to the front surface of the substrate 2. The solution inlet 1a of the cup 1, the solution circulating pump 8, the storage tank 7, and the plating bath 6 are connected with pipes. The circulation of the solution is indicated by the arrows 9. The plating solution is injected into the cup 1 from the inlet 1a. When the surface 9a of the plating-solution reaches the front surface of the substrate 2, the solution flows from the plating bath 6 through the solution outlets 1b on the side walls of the cup 1. Then, the solution in the plating bath 6 is drawn through the drain 6a into the storage tank 7. The solution in the storage tank 7 is again sent to the cup 1 by the solution circulating pump 8. The anode 4 is disposed in the cup 1 opposite to and parallel with the surface of the substrate 2. When the cup is filled with the plating solution and a current is applied across the anode 4 and the substrate 2 which is connected to the cathode contact pins 5, electrolysis of the plating solution occurs, and a plating metal is deposited on the front surface of the substrate 2. In this way, the electroplating is carried out.

In the above-described prior art electroplating apparatus, however, since the substrate 2 is disposed with the front surface to be plated with metal looking downward, bubbles caused by the plating solution circulating system or bubbles of gas caused by the cathode reaction are unfavorably attached to the front surface of the substrate, resulting in an imperfect plating. Further, since the front surface of the substrate looks downward, the substrate must be manually set by an operator using tweezers, and it is difficult to automate the placement of the substrate.

The inventor of the present invention proposed an electroplating apparatus in which a substrate is set in a cup with its front surface looking upward, in Japanese Published Patent Application No. Hei. 1-294888. In this apparatus, however, a complicated mechanism is required for transferring the substrate from a substrate stage to a vacuum chuck of a robot, and an automatic transfer of the substrate using a simple uniaxial robot which moves only in vertical and horizontal directions is impossible.

Further, in the prior art electroplating apparatus of FIG. 17, although an electric circuit comprising the power supply 3, the anode 4, and the cathode 5 is provided for each cup, actually leakage current is generated with the electrolytic plating solution as a medium as shown in FIG. 17. In order to avoid the leakage current, it is necessary to provide a plating bath for each cup. If more than two cups are disposed in the same plating bath, not only anodes but also cathodes of the respective cups are at the same voltage, i.e., the respective cups are equivalent to a parallel circuit. Therefore, in a case where a constant current supply employed as the power supply 3, if the contact resistance between the cathode contact part and the substrate varies from cup to cup, different amounts of current are applied to the respective substrates, so that the thicknesses of the plated layers on the respective substrates in the same plating bath cannot be precisely controlled. Further, in the prior art electroplating apparatus, simultaneous processing using two or more current conditions is impossible due to the interaction caused by the leakage current in the plating bath.

In order to solve the above-described problems, the inventor of the present invention proposed an improved electroplating apparatus in which a substrate 2 is disposed in each cup 1 with its front surface looking upward and the respective cups 1 include anodes 4 of the same voltage, in Japanese Published Utility Model Application No. Hei. 3-85470. In this structure, however, not only the anode but also the cathode must be independent to solve the above-described problems.

That is, the above-described problems are easily solved if a plating solution circulating system is provided for each cup, i.e., each wafer. However, when a lot of substrates are processed at the same time in an electroplating apparatus, the concentration of the plating solution must be uniform throughout the cups containing the respective substrates, so that the plating solution circulating system for each cup must have means for controlling the concentration of the solution. Therefore, this structure is of no practical use.

Furthermore, since the substrate is in contact with the tips of the cathode contact pins fixed to the cup, even a slight difference in the heights of the cathode contact pins affect the contact between the substrate and the plating solution, and a variation in the flow velocity of the plating solution causes an uneven thickness of the plated layer on the front surface of the substrate. Therefore, the height of the cathode contact pin must be precisely adjusted. However, such a precise adjustment is difficult and requires much time.

Further, when a plating solution which is relatively unstable and easily produces abnormal Au deposition when it is decomposed, for example, Au sulfite, is employed, the cup must be hermetically sealed so that the plating solution is not in contact with air. In the prior art plating bath 6 in which the plating solution is exposed to air, sulfite ions are oxidized due to the mixing of oxygen 11 in air and the plating solution, and Au particles 12 which cause the decomposition of the plating solution are produced. In this case, the lifetime of the plating solution is reduced compared to plating in a beaker with less agitation and invasion of air.

Further, at the surface of the plating solution, recrystallization of Au occurs due to evaporation of the solution, resulting in electroless deposition of Au.

Further, as illustrated in FIG. 10, when Au is selectively plated in a via-hole 2a in a substrate 2 and having a width of several tens of microns and a depth of several tens to several hundreds of microns as well as on part of the substrate 2 in the vicinity of the via-hole 2a using a photoresist mask 2b, since the ratio of the internal area of the via-hole 2a to the whole area to be plated is large, the plating rate is adversely affected by the variations in the depth of the via-hole during plating.

SUMMARY OF THE INVENTION

An object of the present invention is to provide an electroplating apparatus that performs an automatic processing using a relatively simple robot, for example, a uniaxial robot.

Another object of the present invention is to provide an electroplating apparatus that prevents interaction between a plurality of cups each containing a substrate due to leakage current and that makes the ion concentration of the plating solution uniform throughout the respective cups.

Still another object of the present invention is to provide an electroplating apparatus that precisely controls the thickness of the plated layer on the substrate.

A further object of the present invention is to provide an electroplating apparatus that makes the lifetime of the plating solution longer even if the plating solution is relatively unstable, like Au sulfite, and easily produces abnormal Au deposition when decomposed.

A still further object of the present invention is to provide an electroplating apparatus that performs selective electroplating in a via-hole in which the plating rate is not adversely affected by the variation in the depth of the via-hole during plating.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an electroplating apparatus comprises a cup in which a substrate is subjected to electroplating; a vertically movable substrate stage on which the substrate is mounted with its front surface looking upward, having an opening of a diameter smaller than the diameter of the substrate; a plating solution injector through which a plating solution is introduced into the cup; a first exhaust port through which the plating solution is exhausted; an anode electrode having a plurality of holes and attached to a lower end of the plating solution injector opposite and parallel to the front surface of the substrate; a cathode contact mechanism including a cathode contact pin to be connected to the substrate; and a vertically movable spin chuck, the center of which is aligned with the center of the substrate stage, having a diameter smaller than the diameter of the opening of the substrate stage. In this electroplating apparatus, the plating solution is introduced into the cup from the plating solution injector and applied to the surface of the substrate through the holes of the anode electrode. Initially, the substrate is put on the spin chuck. When the substrate stage moves up, the substrate on the spin chuck is transferred to the substrate stage. Then, the substrate stage with the substrate closes the cup from the bottom, and the substrate is subjected to an electroplating in the cup. After the electroplating, the substrate stage moves down, and the substrate is transferred to the spin chuck. Therefore, an automatic transfer of the substrate is possible using a uniaxial robot which moves only in the vertical or horizontal directions.

According to a second aspect of the present invention, in an electroplating apparatus including at least two cups, each cup is provided with a plating solution storage tank and a plating solution circulating system. Further, the respective tanks are connected to a reserve tank via valves. During the electroplating, the respective plating solution circulating systems are separated from each other. When the electroplating is not performed, the plating solution is common to all the circulation systems via the reserve tank. Therefore, interaction between adjacent cups due to leakage current produced between the cups with the plating solution as a medium is avoided, and the ion concentration of the plating solution is made uniform.

According to a third aspect of the present invention, the plating solution injector is movable in the vertical direction, so that the distance between the injector and the substrate can be varied to control the flow velocity of the plating solution on the substrate.

According to a fourth aspect of the present invention, a second exhaust port is disposed penetrating through a part of the substrate stage. After the electroplating process, the plating solution remaining in the cup is pushed out the second exhaust port by an inert gas introduced into the cup from the plating solution injector. In this structure, since the plating solution is not in contact with air, oxidation of the solution is avoided. Further, an expensive plating solution can be collected and reused.

According to a fifth aspect of the present invention, a plating solution storage tank includes a vent hole for preventing an excessive increase in the internal pressure of the tank, a GORE-TEX brand expanded polytetrafluoroethylene; film covering the vent hole, and cooling coils for condensing vapor (GORE-TEX is a trademark of W. L. Gore & Associates of Newark, Del. The internal space of the tank is filled with an inert gas. In this structure, since the plating solution is not in contact with air, oxidation of the plating solution is avoided. Further, the GORE-TEX film covering the air vent of the tank confines moisture within the tank and maintains a low pressure in the tank even if the inert gas is continuously introduced into the tank. The cooling coils for condensing vapor keep the internal wall of the tank wet, whereby recrystallization of the plating solution due to drying is avoided.

According to a sixth aspect of the present invention, a toroidal metal ring is interposed between the cathode contact mechanism and the substrate for making a cathode contact at the periphery of the substrate. The center of the metal ring is aligned with the center of the substrate. The metal ring is in contact with the substrate at a plurality of lines, so that it is not tightly adhered to the substrate after the plating process. Further, the metal ring also serves as an electroplating offset part. That is, when a selective plating is carried out in a via-hole having a depth of several tens to several hundreds of microns and formed in a substrate by RIE and the like, if the area of the metal ring is sufficiently large relative to the area of the via-hole, the variation in the plating rate due to the depth of the via-hole is suppressed, resulting in a stable plating rate.

According to a seventh aspect of the present invention, in an electroplating method using the above-described electroplating apparatus, the plating solution is circulated through a storage tank and a pump while the electroplating is not being carried out. Then, the internal wall of the cup is washed with water and the water is drained from the first exhaust port by expelling the water with an inert gas introduced into the cup. Thereafter, the plating solution is introduced into the cup, and the electroplating is carried out on the substrate while circulating the plating solution. After the electroplating, the plating solution is drained from the second exhaust port into the storage tank by expelling the solution with the inert gas. Finally, the internal wall of the cup is washed with water, and the water is drained from the first exhaust port.

BRIEF DESCRIPTION OF THE DRAWINGS

FIGS. 1(a) and 1(b) are sectional views illustrating an electroplating apparatus in accordance with a first embodiment of the present invention.

FIGS. 2(a) and 2(b) are sectional views illustrating an electroplating apparatus in accordance with a second embodiment of the present invention.

FIGS. 8(a) and 8(b) are sectional views illustrating an electroplating apparatus in accordance with a ninth embodiment of the present invention.

DETAILED DESCRIPTION OF THE PREFERRED EMBODIMENTS

Figure 17:
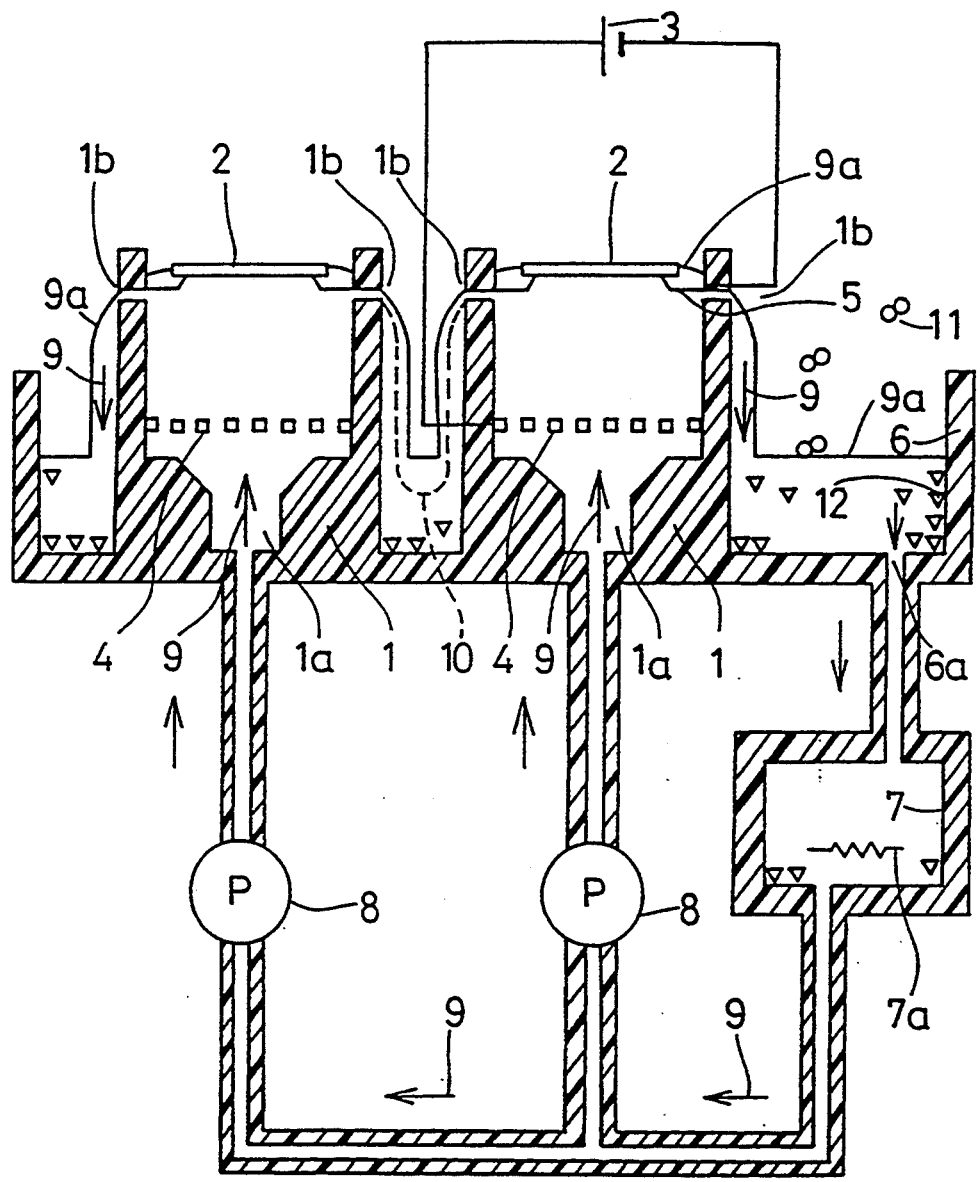
FIG. 17 is a sectional view illustrating an electroplating apparatus in accordance with the prior art.

FIGS. 1(a) and 1(b) are sectional views illustrating an electroplating apparatus in accordance with a first embodiment of the present invention. In these figures, the same reference numerals as in FIG. 17 designate the same or corresponding parts. A substrate processing cup 1 (hereinafter referred to simply as cup) is provided with a plating solution exhaust port 1b, a plating solution injector 1a, and a cathode contact mechanism 55. The lower part of the cup 1 is open. The plating solution injector 1a penetrates through a center portion of the cup 1. An anode 4 comprising a metal plate having a plurality of holes 1e is attached to a lower end of the injector 1a opposite and parallel to the surface of the substrate 2. In this structure, a cathode is the substrate 2 which is in contact with a cathode pin of the cathode contact mechanism 55.

A substrate mounting stage 1c is disposed beneath the cup 1 so that the center of the stage 1c is aligned with the center of the cup 1. The substrate mounting stage 1c is movable in the vertical direction and has an opening at the center thereof. The substrate 2 is disposed on the stage 1c via sealant 1g. The stage 1c with the substrate 2 moves up and seals the cup 1, i.e., it serves as a lid for the cup 1.

A spin chuck 111 is disposed beneath the substrate mounting stage 1c so that the center of the spin chuck 111 is aligned with the center of the stage 1c. The diameter of the spin chuck 111 is the same as or smaller than the diameter of the opening of the stage 1c. A hole 115 penetrates through the center of the spin chuck 111 through which air is evacuated to fix the substrate 2 on the spin chuck 111.

A description is given of the operation.

First of all, the substrate 2 is mounted on a substrate cassette (not shown) and carried to the spin chuck 111 using a uniaxial carrier robot (not shown) which moves only in vertical or horizontal directions (FIG. 1(b)). Then, the substrate stage 1c moves up and the substrate 2 on the spin chuck 111 is transferred to the stage 1c. The stage 1c with the substrate 2 moves up and hermetically seals the cup 1 ( FIG. 1(a)).

In this state, the plating solution 9 is injected into the cup 1 through the anode 4 of the plating solution injector 1a, applied to the surface of the substrate 2, and exhausted from the plating solution exhaust port 1b through the space between the outer wall of the injector 1a and the inner wall of the cup 1. This flow of the plating solution is indicated by arrows 9 in FIG. 1(a). When the cup 1 is filled with the plating solution 9, an electric field is applied across the anode 4 and the cathode, i.e., the substrate 2, for flow of a current between the electrodes, whereby a plated metal layer is formed on the substrate 2. When the plating is completed, the supply of the current and the circulation of the plating solution are stopped, and wash water is introduced into the cup in the same manner as described above to clean the plating solution the surface of the substrate 2 and the internal wall of the cup 1. Then, the substrate mounting stage 1c is moved downward, and the substrate 2 is transferred to the spin chuck 111. The substrate 2 is fixed to the spin chuck 111 by evacuating air through the hole 115 of the spin chuck 111. The spin chuck 111 is spun to dry the substrate 2.

In the electroplating apparatus according to the first embodiment of the present invention, since the substrate mounting stage 1c and the spin chuck 111 are employed, automatic transfer of the wafer is easily achieved using a uniaxial robot of a simple structure that is movable only in the vertical or horizontal directions. Further, since the plating solution inlet and outlet are disposed at the upper part of the cup 1, the flow speed of the solution is reduced.

FIGS. 2(a) and 2(b) are sectional views illustrating an electroplating apparatus in accordance with a second embodiment of the present invention. In the electroplating apparatus of the above-described first embodiment, there is a possibility of a breakage of the substrate 2 if the internal pressure of the cup 1 is too high. Therefore, in this second embodiment, a substrate mounting stage 112 includes a spin chuck. In this structure, as shown in FIG. 2(a), since the substrate 2 in the cup 1 is fixed onto the stage 112 by evacuating air through the hole 115, the substrate 2 is not broken. Further, the diameter of the substrate mounting part 112a of the stage 112 is smaller than the diameter of the substrate 2, so that the automatic transfer of the substrate using the uniaxial robot is possible as in the above-described first embodiment.

Figure 3A:
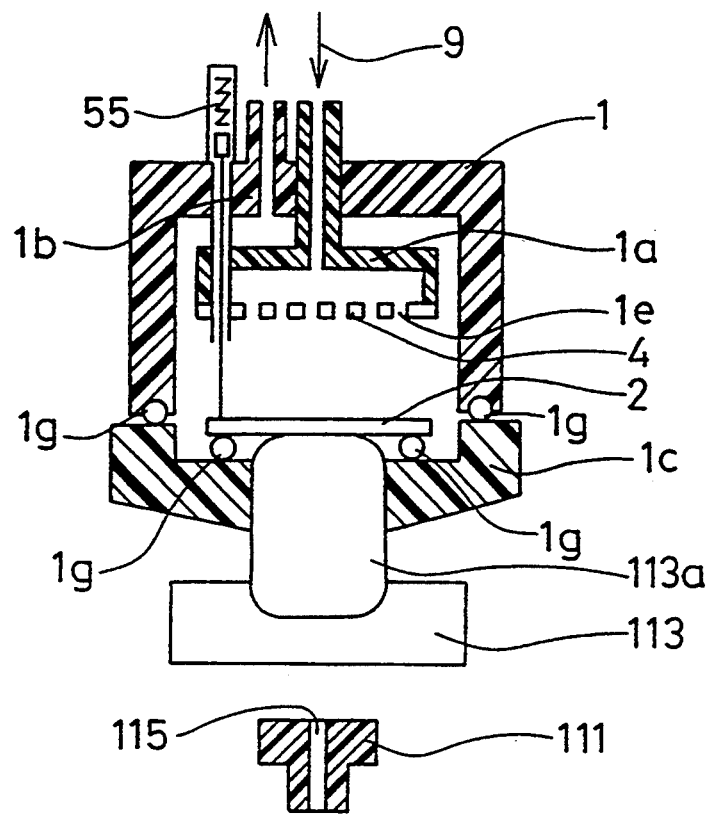
FIGS. 3(a) and 3(b) are sectional views illustrating an electroplating apparatus in accordance with a third embodiment of the present invention.
Figure 3B:
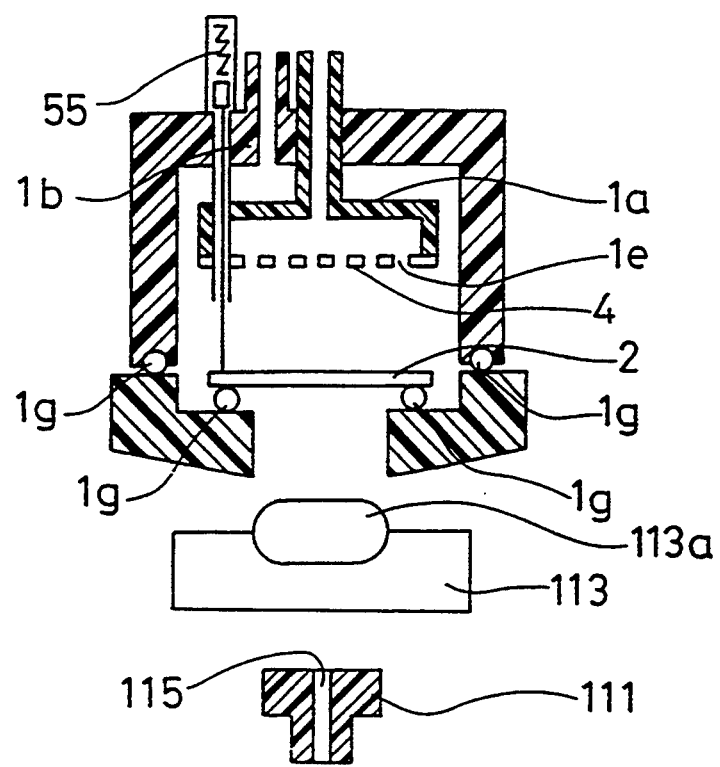

FIGS. 3(a) and 3(b) are sectional views illustrating an electroplating apparatus in accordance with a third embodiment of the present invention.

In this third embodiment, after the substrate mounting stage 1c moves up and hermetically seals the cup 1, an internal and external pressure balancing plate 113 with an expanding and shrinking part 113a, like a balloon is inserted between the stage 1c and the spin chuck 111 (FIG. 3(b)), and the balloon part 113a is expanded during the electroplating (FIG. 3(a)) to balance the internal pressure of the cup 1 with the external pressure, whereby the substrate 2 is not broken.

Figure 4:
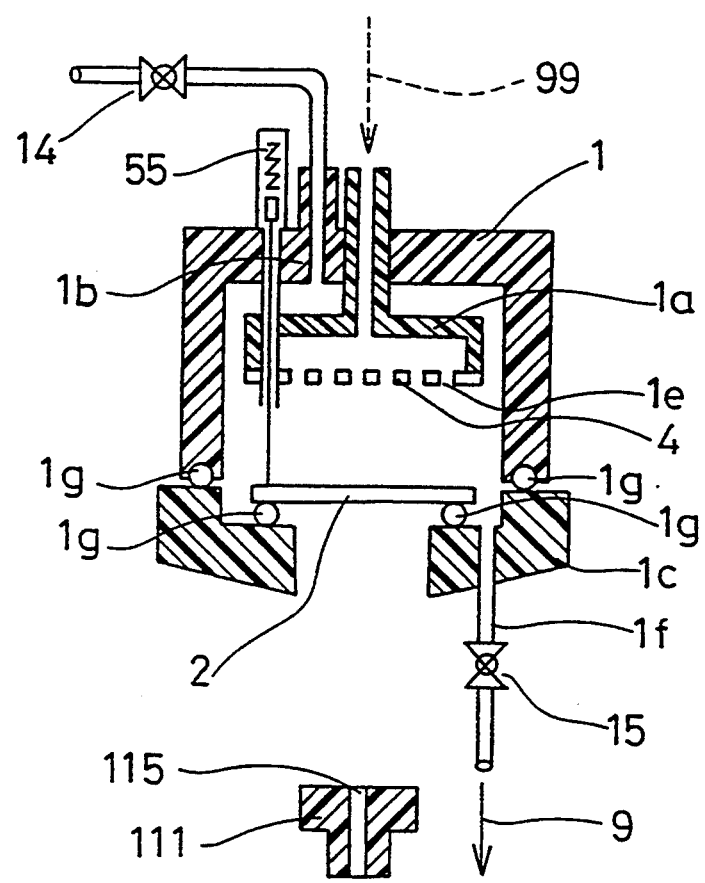
FIG. 4 is a sectional view illustrating an electroplating apparatus in accordance with a fourth embodiment of the present invention.

FIG. 4 is a sectional view illustrating an electroplating apparatus in accordance with a fourth embodiment of the present invention.

In the above-described first to third embodiments, after the electroplating process, the wash water is introduced into the cup 1 where the plating solution remains. This system incurs a considerable loss if an expensive plating metal, such as precious metal, is employed. Therefore, in this fourth embodiment, the substrate mounting stage 1c includes a plating solution drain 1f, and the plating solution injector 1a is connected to an inert gas supply (not shown).

A description is given of the operation.

In this fourth embodiment, after the electroplating process, a first valve 14 connected to the plating solution exhaust port 1b is closed while a second valve 15 connected to the plating solution drain 1f is opened, and an inert gas 99 is introduced into the cup 1 from the inlet of the plating solution injector 1a to drive out the plating solution remaining in the cup 1 through the plating solution drain 1f.

In this structure, since the plating solution circulating system is filled with the inert gas so that the plating solution is not in contact with air, oxidation of the solution is avoided. Further, an expensive plating solution can be collected and reused.

A description is given of a fifth embodiment of the present invention.

While in the above-described first embodiment the plating solution injector 1a is fixed in the hole of the cup 1, it may be movably inserted in the hole of the cup 1. In this case, since the plating solution injector 1a is movable in the vertical direction, the space between the injector 1a and the substrate 2 is controlled to optimize the flow velocity of the plating solution on the substrate 2, whereby the uniformity of the thickness of the plated layer on the substrate is improved.

Figure 5:
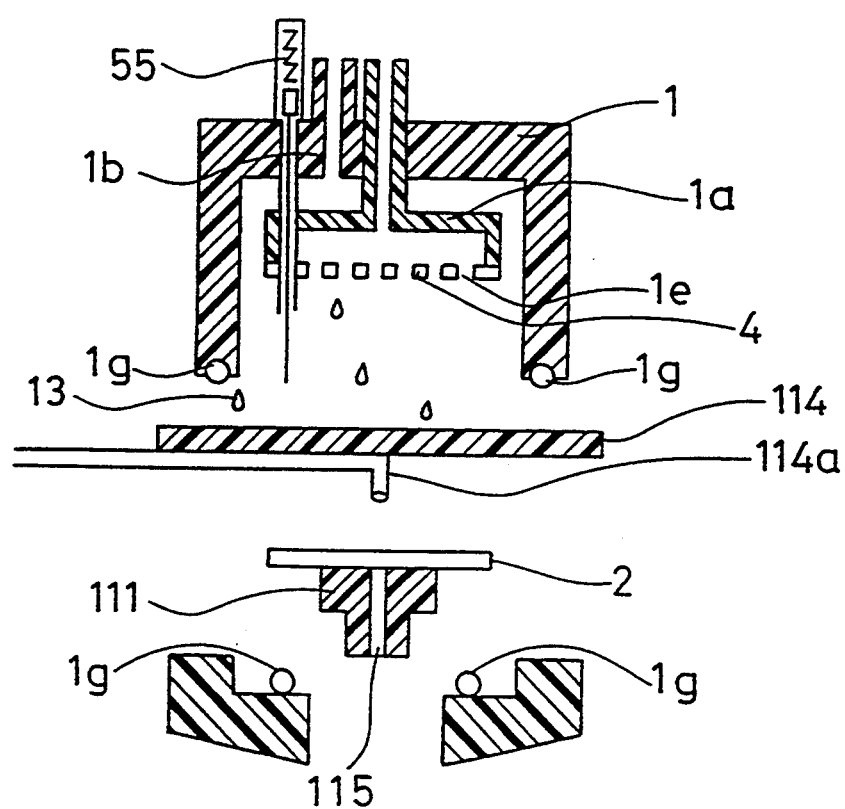
FIG. 5 is a sectional view illustrating an electroplating apparatus in accordance with a sixth embodiment of the present invention.

FIG. 5 is a sectional view illustrating an electroplating apparatus in accordance with a sixth embodiment of the present invention. The electroplating apparatus of this sixth embodiment includes a drip-proof plate 114 and a mechanism for inserting the drip-proof plate 114 between the cup 1 and the substrate 2 (for example, rotating mechanism) when the substrate mounting stage 1c is disconnected from the cup 1. A nozzle 114a attached to the rear surface of the drip-proof plate 114 is used when the substrate is subjected to a hydrophilic treatment using a active surface agent before the electroplating or when the substrate is washed with water while spinning the spin chuck 111 after the electroplating. The drip-proof plate 114 prevents water droplets 13 from the cup 1 and the injector 1a from falling on the substrate 2 before drying of the substrate.

Figure 6:
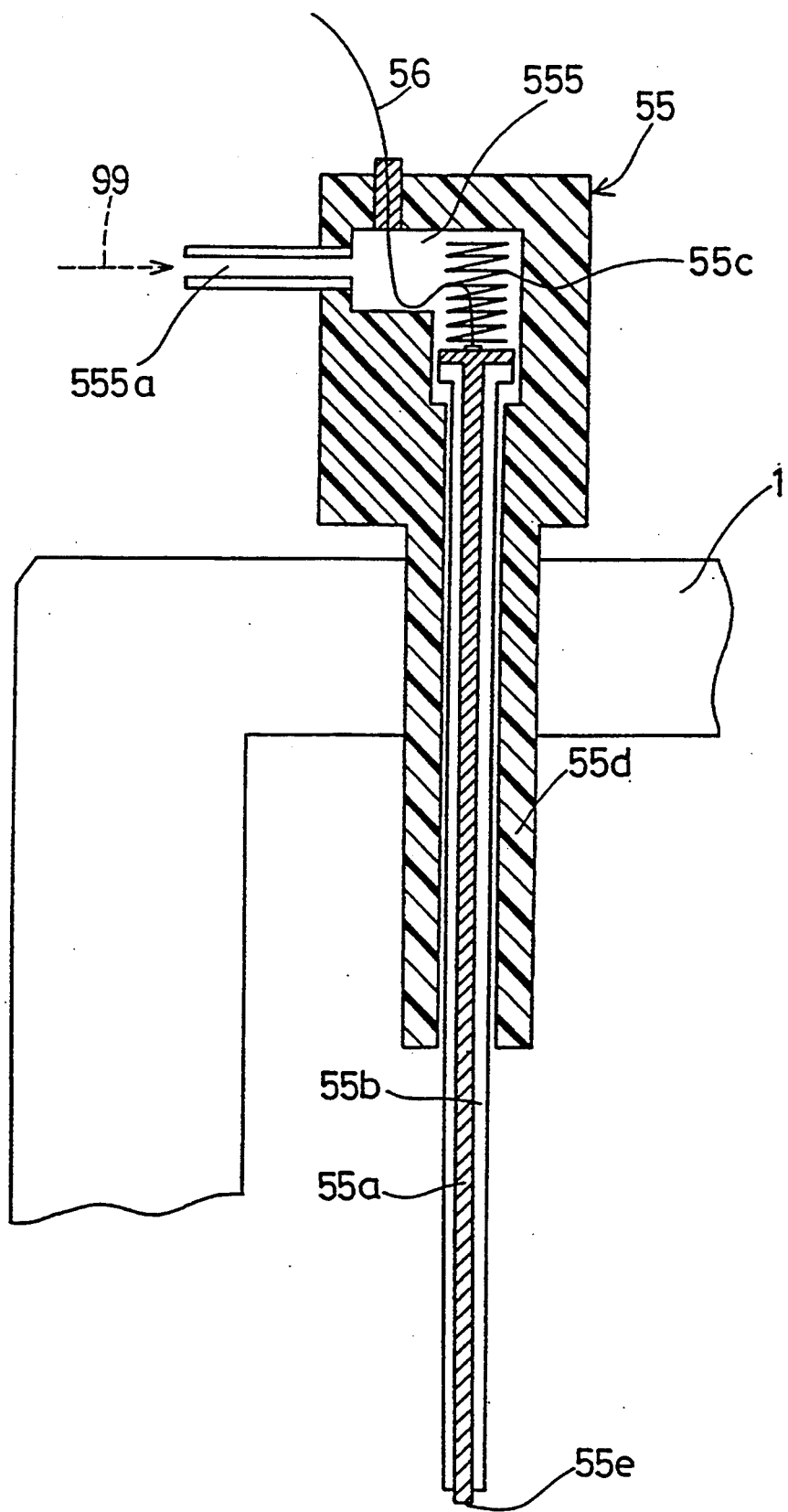
FIG. 6 is a sectional view illustrating a cathode contact mechanism of an electroplating apparatus in accordance with a seventh embodiment of the present invention.

FIG. 6 is a sectional view illustrating a cathode contact mechanism of an electroplating apparatus in accordance with a seventh embodiment of the present invention.

In FIG. 6, a cathode pin guide 55d penetrates through a part of the cup 1. A cathode pin 55a coated with an insulating material 55b except opposite ends is inserted in the cathode pin guide 55d. An upper end of the cathode pin 55a is connected to a negative electrode of a power supply (not shown) via a wire 56. A spring 55c for making the cathode pin 55a movable in the vertical direction is disposed on the cathode pin 55a. The upper end of the cathode pin 55a and the spring 55c are contained in a chamber 555. The chamber 555 is connected to a vent 555a through which an inert gas 99 is introduced. In this structure, the chamber 555 and the space between the cathode pin 55a and the internal wall of the pin guide 55d are always filled with the inert gas introduced from the Vent 555a to prevent the plating solution from entering the cathode contact mechanism 55.

Figure 7:
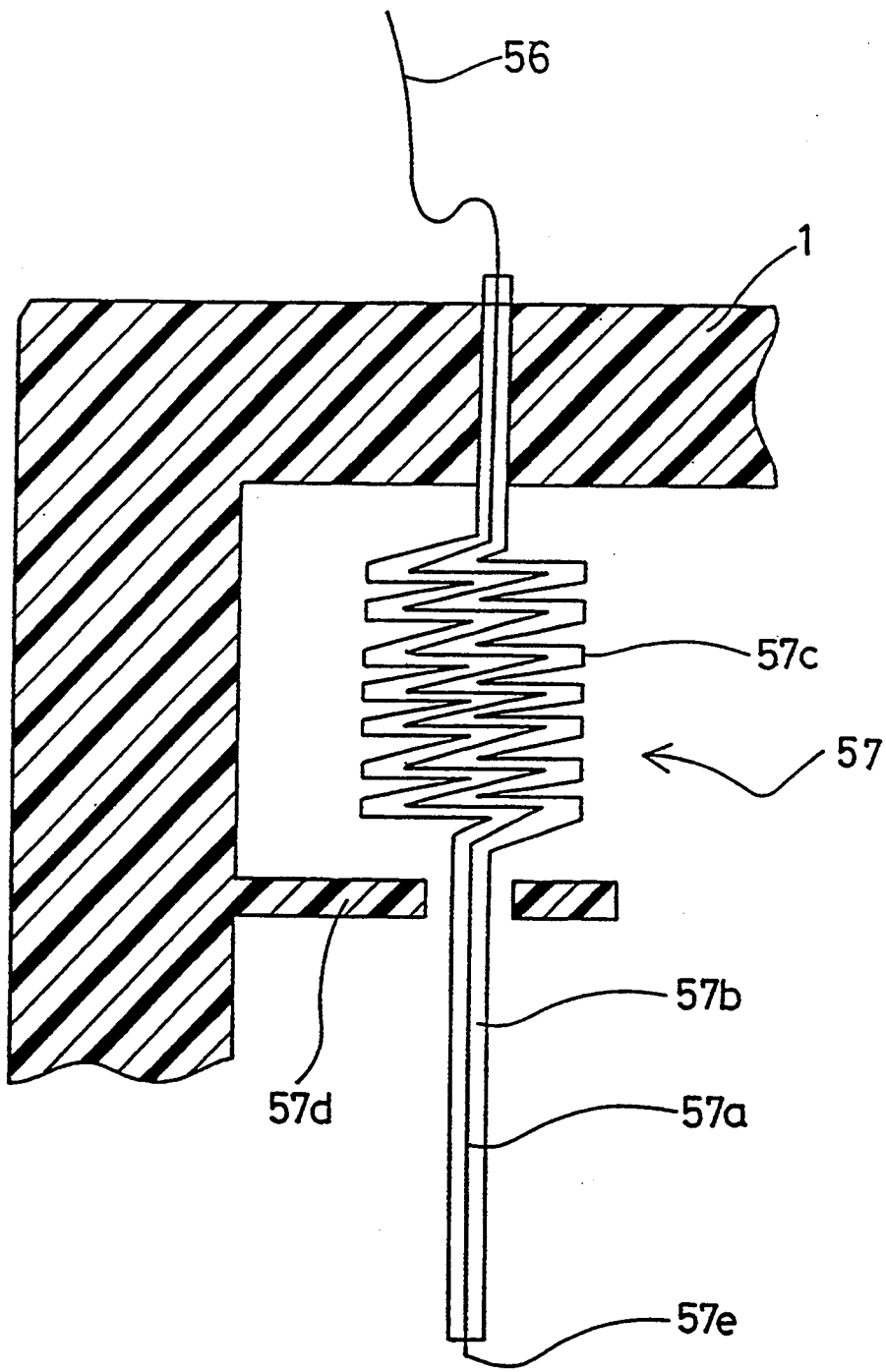
FIG. 7 is a sectional view illustrating a cathode contact mechanism of an electroplating apparatus in accordance with an eighth embodiment of the present invention.

FIG. 7 is a sectional view illustrating a part of a cathode contact mechanism of an electroplating apparatus in accordance with an eighth embodiment of the present invention. In FIG. 7, a cathode contact pin 57a and a spring 57c are unitary. The cathode contact pin 57a is coated with an insulating material 57b except for an upper end and a lower end that is in contact with the substrate 2. A cathode pin guide 57d is disposed on the internal side wall of the cup 1 at a position beneath the spring part 57c of the cathode pin 57a. The upper end of the cathode pin 57a protrudes from the upper surface of the cup 1 and is connected through a wire 56 to a negative electrode (not shown).

According to this eighth embodiment of the present invention, since the cathode contact pin 57a is unitary with the spring 57c, the structure of the cathode contact mechanism is simplified.

Figure 9A:
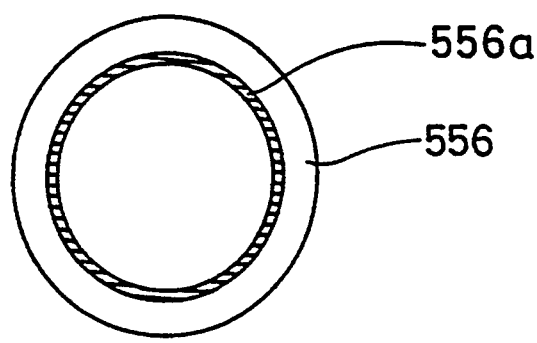
FIGS. 9(a)–9(c) are diagrams illustrating a toroidal contact metal ring used in the electroplating apparatus of FIGS. 8(a)–8(b).
Figure 9B:
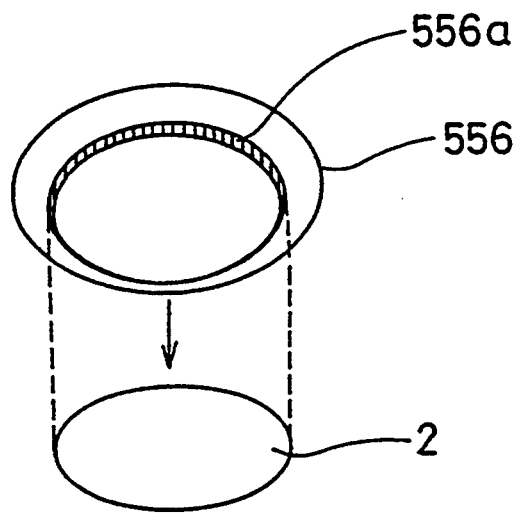
Figure 9C:
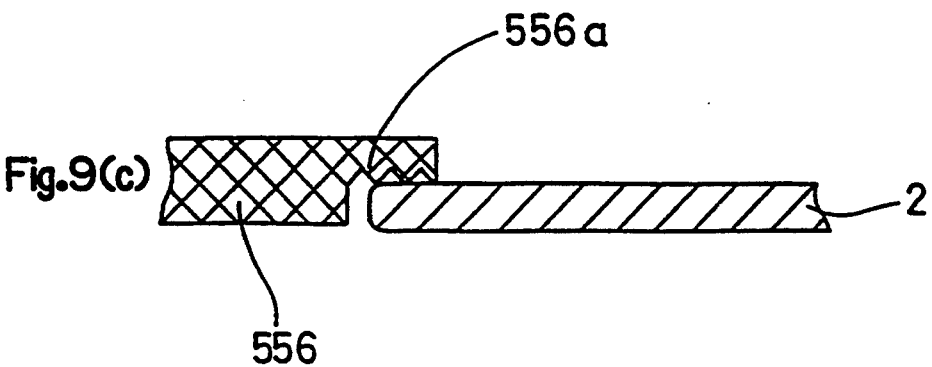

FIGS. 8(a) and 8(b) are sectional views illustrating an electroplating apparatus in accordance with a ninth embodiment of the present invention. FIGS. 9(a)–9(c) are a plan view, a perspective view, and a sectional view, respectively, illustrating a cathode contact ring included in the apparatus of FIGS. 8(a) and 8(b).

In this ninth embodiment, a toroidal cathode contact metal ring 556 is connected to an end of the contact pin to make the cathode contact between the cathode contact mechanism 55 and the substrate 2.

FIG. 9(c) is an enlarged view of a contact part 556a of the cathode contact ring 556 that contacts the substrate 2. The width of the contact part 556a is 1 to 2 mm. The contact part 556a has a cross section of sawtooth, i.e., the contact part 556a is in contact with the substrate 2 along a plurality of circles lines whose centers correspond to the center of the substrate 2, so that the contact ring 556 is not tightly adhered to the substrate 2 after the plating process. Alternatively, the contact part 556a may have a plurality of ridges extending toward the center of the substrate 2.

Figure 10:
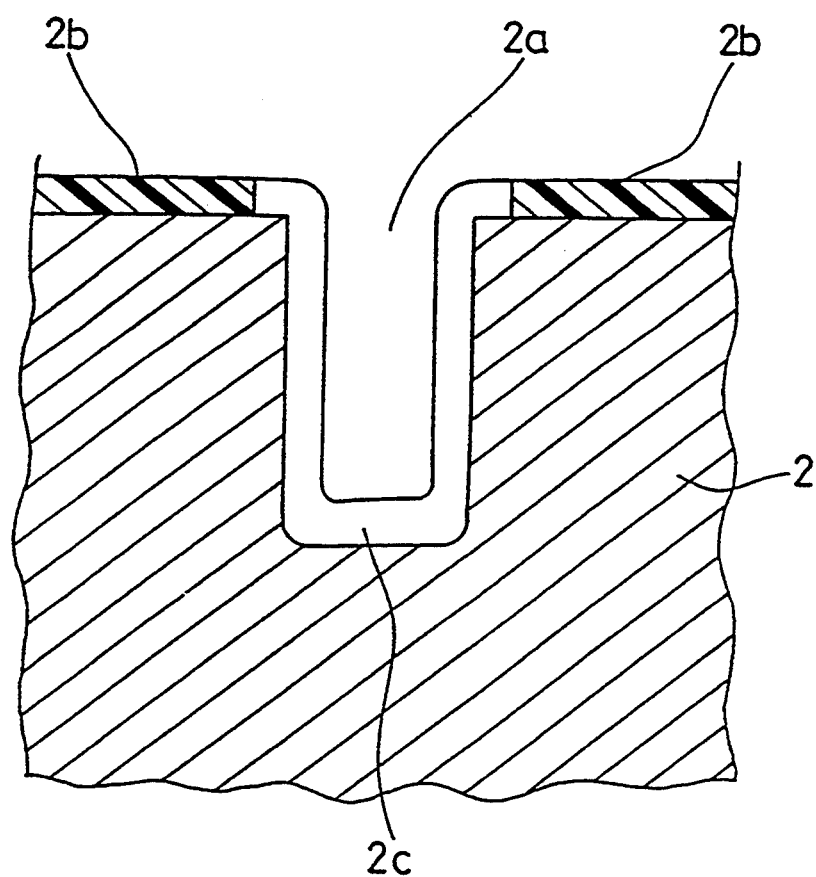
FIG. 10 is a sectional view illustrating a via-hole in which a plated metal layer is formed in accordance with the ninth embodiment of the present invention.

Further, the contact ring 556 which is plated with metal during the electroplating process serves as an electroplated offset part. More specifically, when the substrate 2 has a relatively deep hole, such as the via-hole 2a shown in FIG. 10, and the metal plating is selectively carried out in the via-hole 2a and on part of the substrate 2 in the vicinity of the via-hole, if the area of the metal ring 556 (the offset part) is sufficiently large relative to the area of the via-hole and the part in the vicinity of the via-hole, the variation in the plating rate due to the depth of the via-hole is suppressed, resulting in a stable plating rate.

According to the ninth embodiment of the present invention, since the substrate 2 is fixed using the toroidal cathode contact metal ring 556 connected to the end of the contact pin, a plated metal layer of a uniform thickness is attained in the via-hole 2a.

FIGS. 11(a)–11(b), 12(a)–12(b), and 13 are diagrams for explaining a plating solution circulating system in accordance with a tenth embodiment of the present invention. The electroplating apparatus according to the above-described fourth embodiment (FIG. 4) is employed.

Figure 11A:
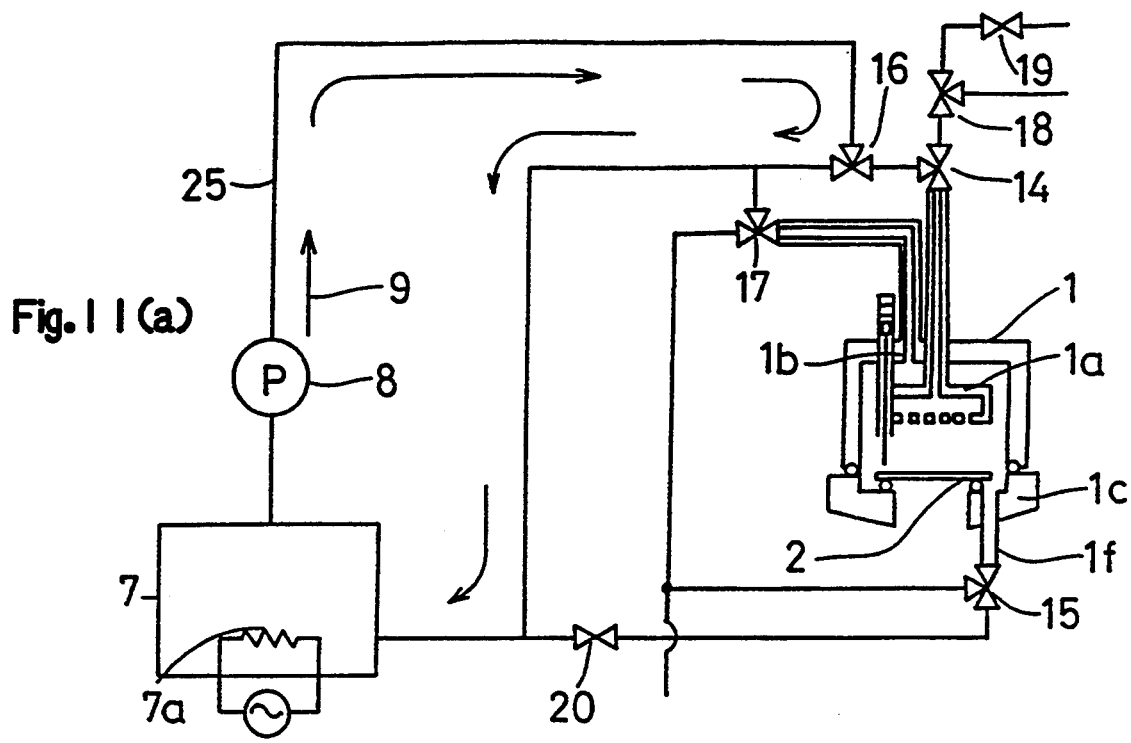
FIGS. 11(a)–11(b), 12(a)–12(b), and 13 are diagrams illustrating a plating solution circulating system in accordance with a tenth embodiment of the present invention.

FIG. 11(a) illustrates the circulation of the plating solution when the electroplating is not carried out. As indicated by arrows 9, the plating solution stored in a tank 7 flows through a pump 8 and a three way valve 16 and returns to the tank 7. The plating solution in the tank 7 is heated by a heater 7a. The circulation keeps the temperature of the solution in the tank 7 and in the pipe 25 uniform.

Figure 12A:
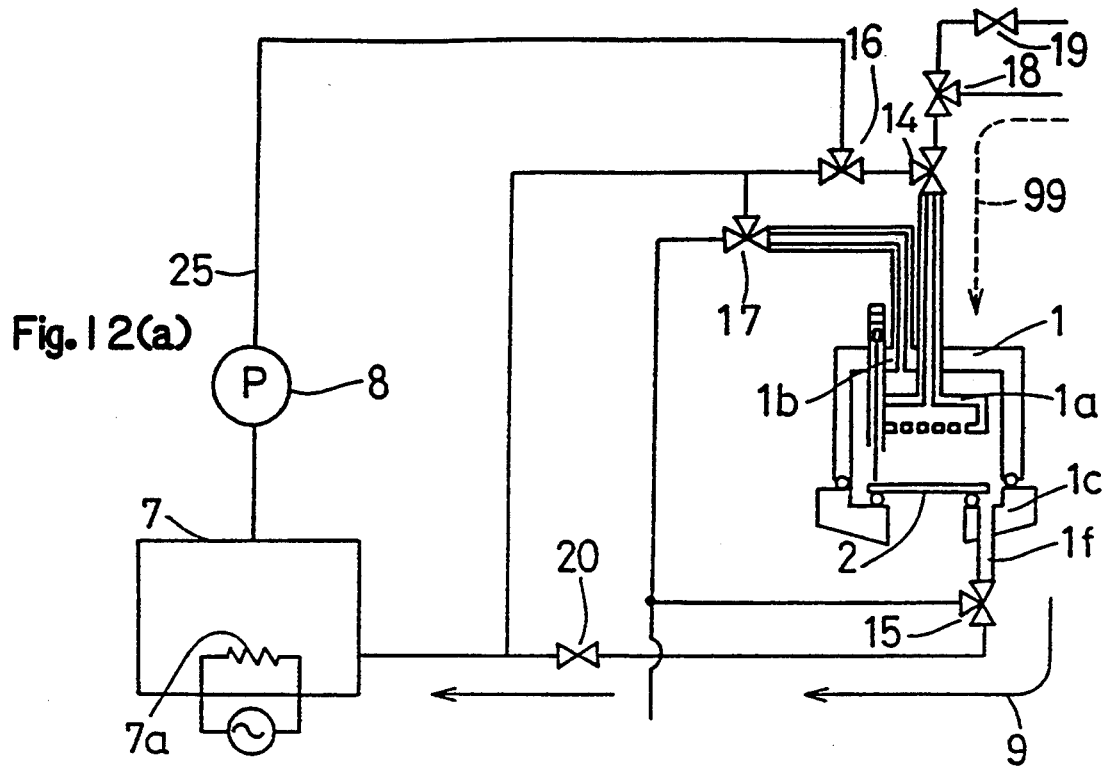
Figure 12B:
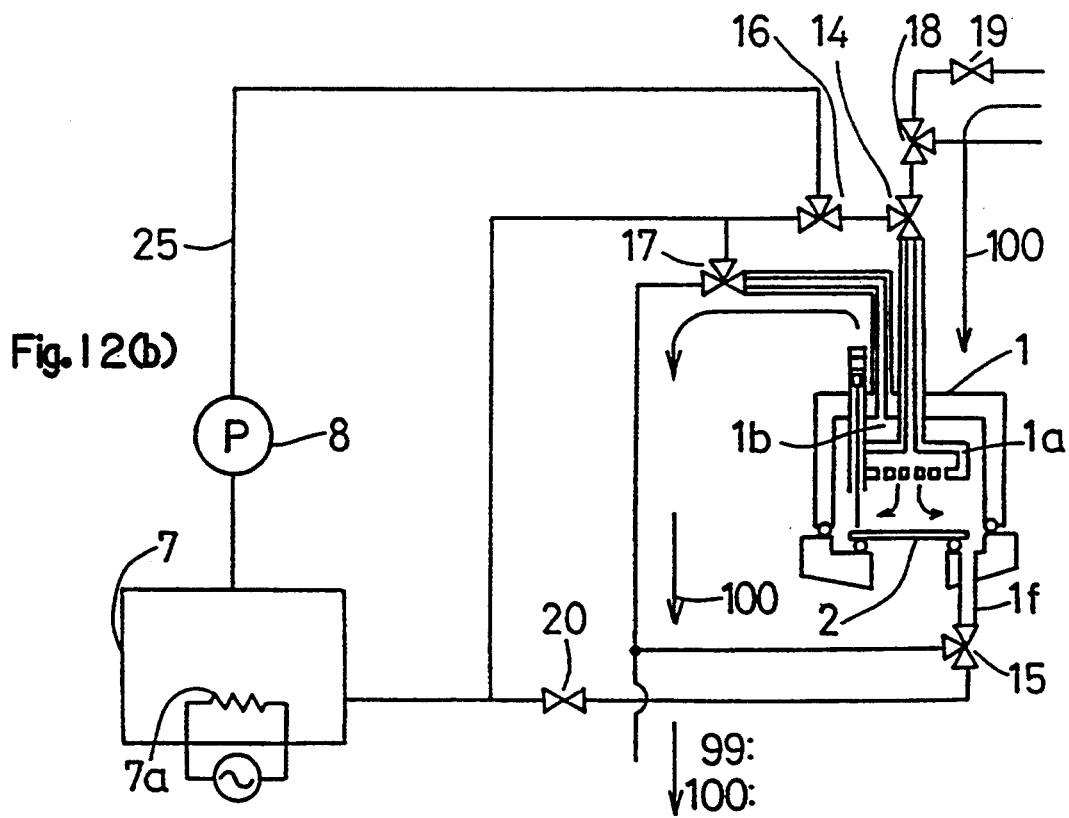
Figure 13:
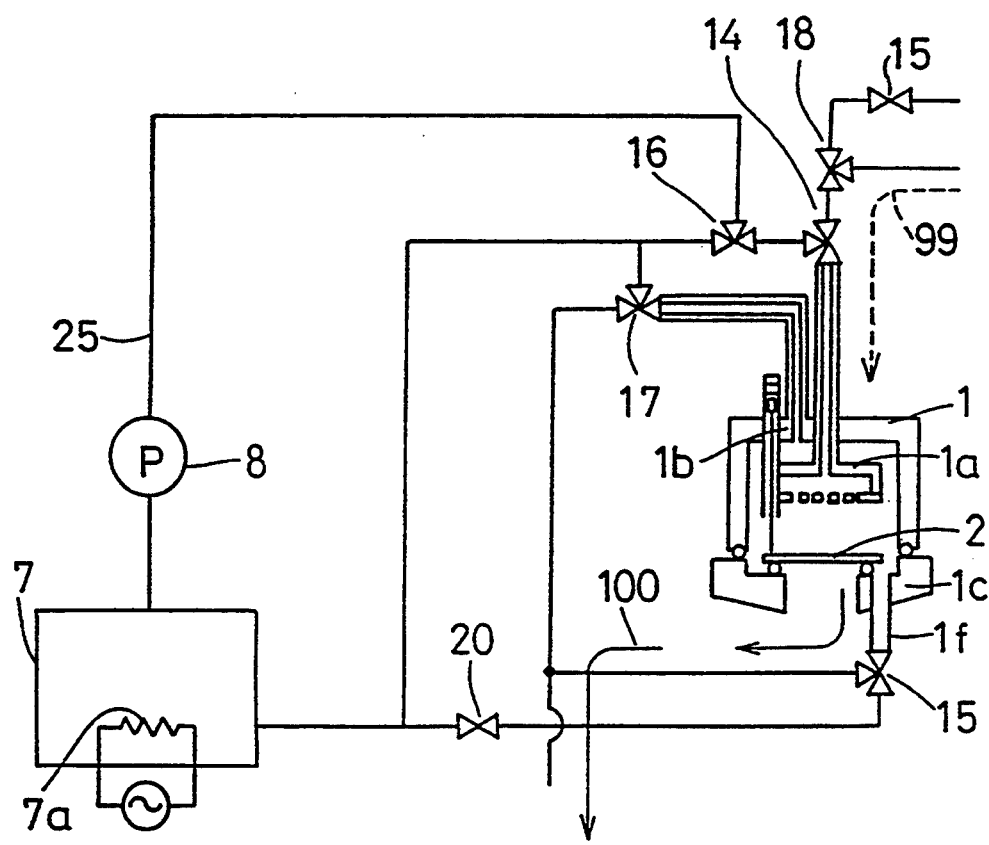

Then, the inside of the cup 1 is washed with water (FIG. 12(b)), and an inert gas is introduced into the cup 1 to expel the water from the exhaust port 1b (FIG. 13). The flow of the wash water is indicated by arrows 100.

Figure 11B:
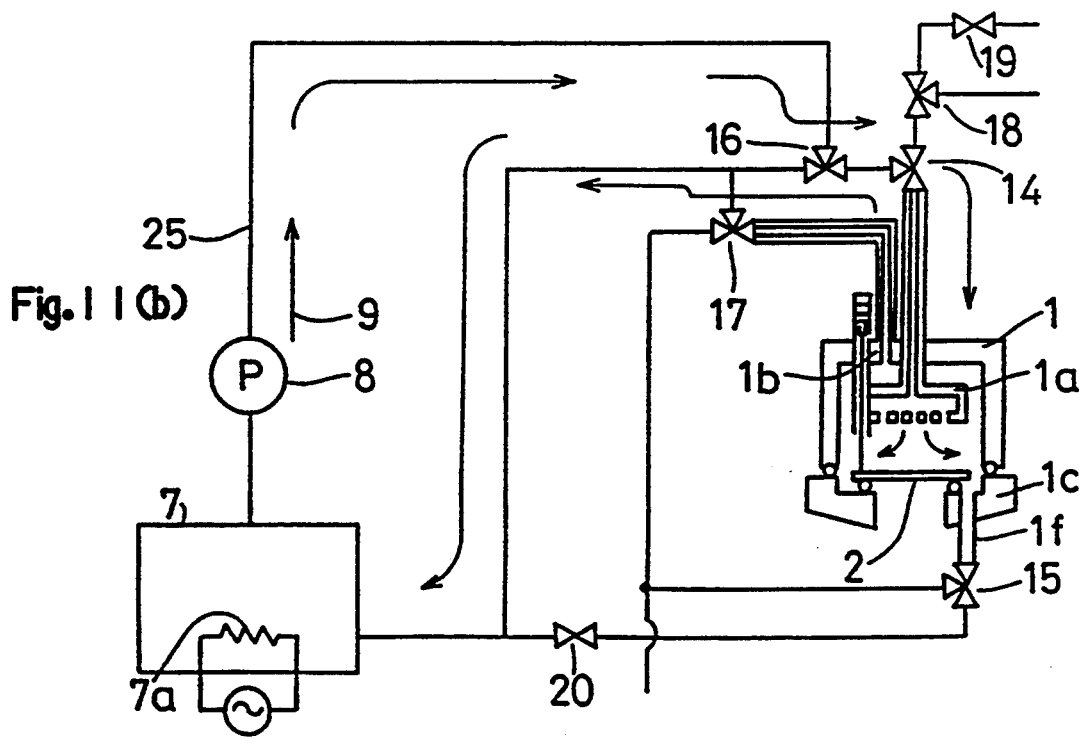

Then, valves 16 and 17 are opened to introduce the plating solution into the cup 1, and the electroplating is carried out while circulating the solution as shown by the arrows 9 (FIG. 11(b)).

After the electroplating process, an inert gas is introduced into the cup 1 to expel the plating solution from the drain if (FIG. 12(a)). The solution is transferred through the pipe 25 to the storage tank 7.

After washing the inside of the cup 1 with water (FIG. 12(b)), inert gas is introduced into the cup 1 to expel the water from the exhaust port 1b (FIG. 13).

In the electroplating method according to the tenth embodiment of the present invention, since each electroplating apparatus has its own plating solution circulating system, unwanted leakage current between adjacent electroplating appartus through the plating solution is avoided. In addition, the ion concentration of the plating solution is made uniform.

Figure 14:
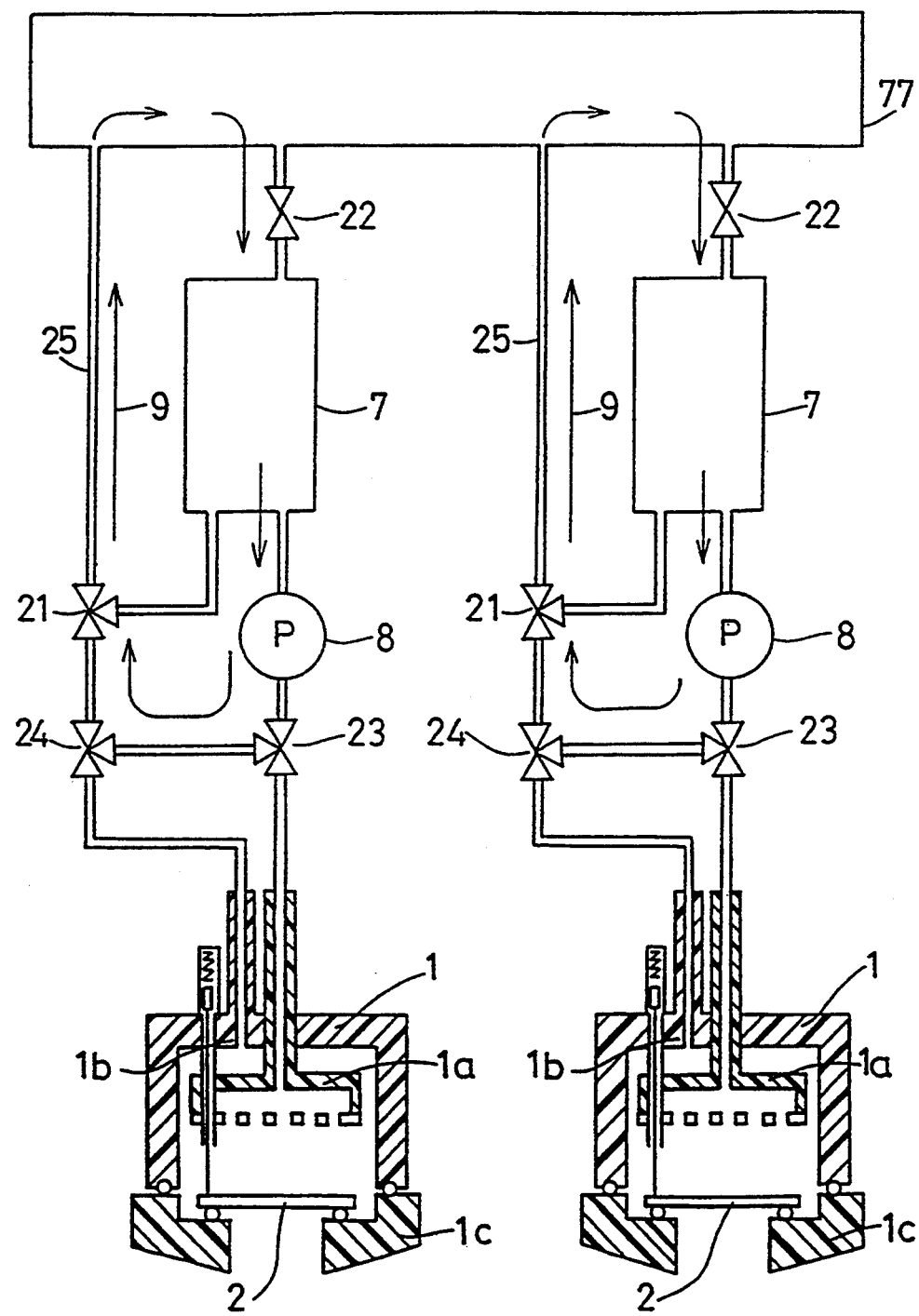
FIGS. 14 and 15 are diagrams illustrating a plating solution circulating system in accordance with an eleventh embodiment of the present invention.
Figure 15:
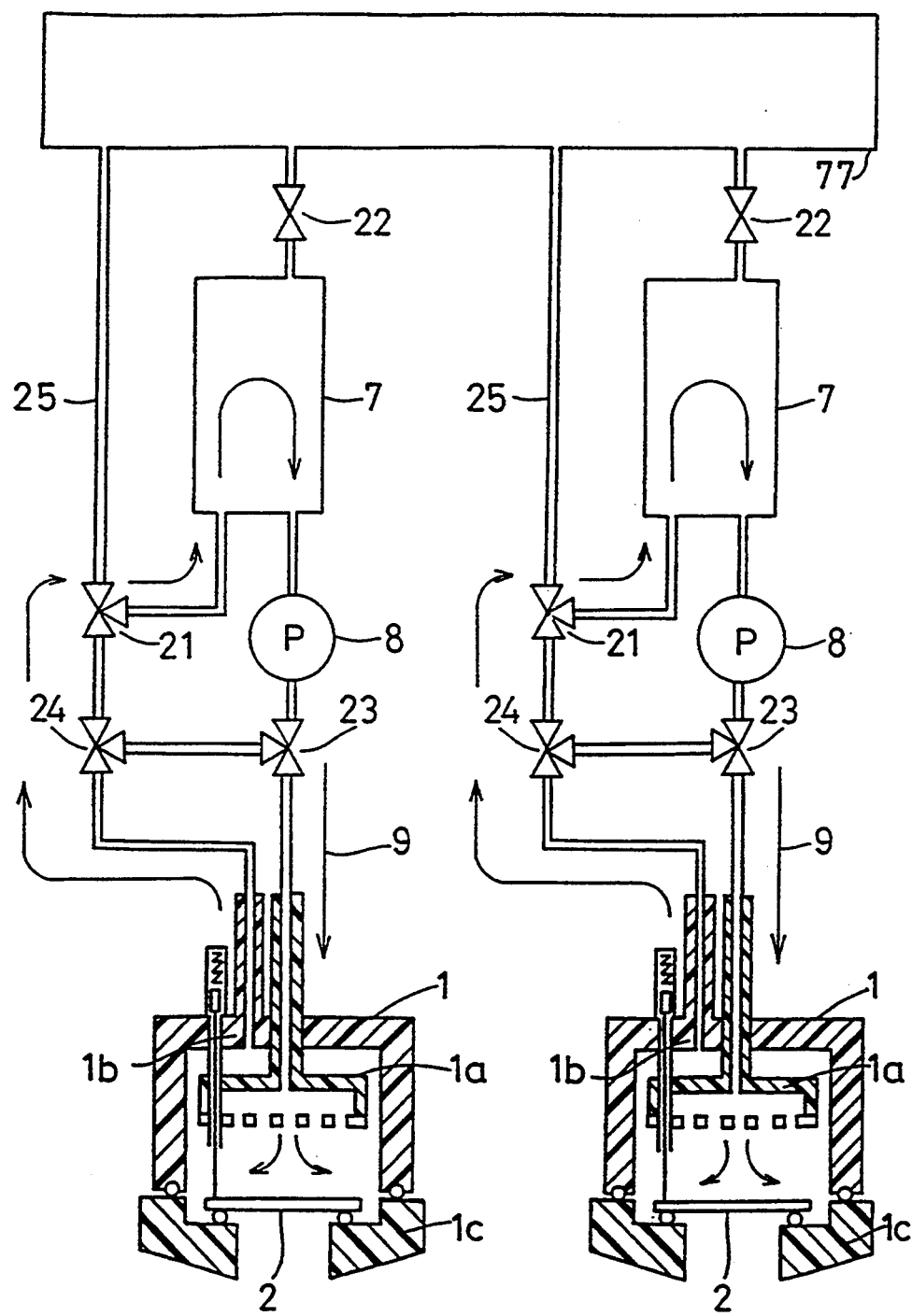

FIGS. 14 and 15 are diagrams for explaining a plating solution circulating system in accordance with an eleventh embodiment of the present invention. In this embodiment, two electroplating appartus each provided with a solution circulating system, are connected via a reserve tank 77. The electroplating apparatus according to the fourth embodiment (FIG. 4) is employed.

FIG. 14 illustrates the circulation of the plating solution when the electroplating is not carried out. As indicated by arrows 9, the plating solution stored in the tank 7 flows through the pump 8, the three way valves 23, 24, and 21, the reserve tank 77, and the valve 22 and returns to the tank 7.

FIG. 15 illustrate the circulation of the plating solution during the electroplating process. The plating solution stored in the tank 7 is transferred through the pump 8 and the three way valve 23 to the cup 1. The solution in the cup 1 flows from the exhaust port 1b, flows through the three way valves 24 and 21, and returns to the storage tank 7. At this time, the valve 22 between the tank 7 and the reserve tank 77 is closed. In this way, two plating solution circulating paths are switched by selectively closing or opening the valves 21, 23, 24, and 22.

According to the eleventh embodiment of the present invention, each electroplating apparatus has its own plating solution circulating system and, furthermore, the plating solution is common to all the circulation systems via the reserve tank 77 only when the electroplating is not carried out. Therefore, unwanted leakage current between adjacent electroplating appartus through the plating solution as a medium is avoided during the electroplating process. When the electroplating is not carried out, the ion concentration of the plating solution is uniform throughout the circulation systems.

Figure 16:
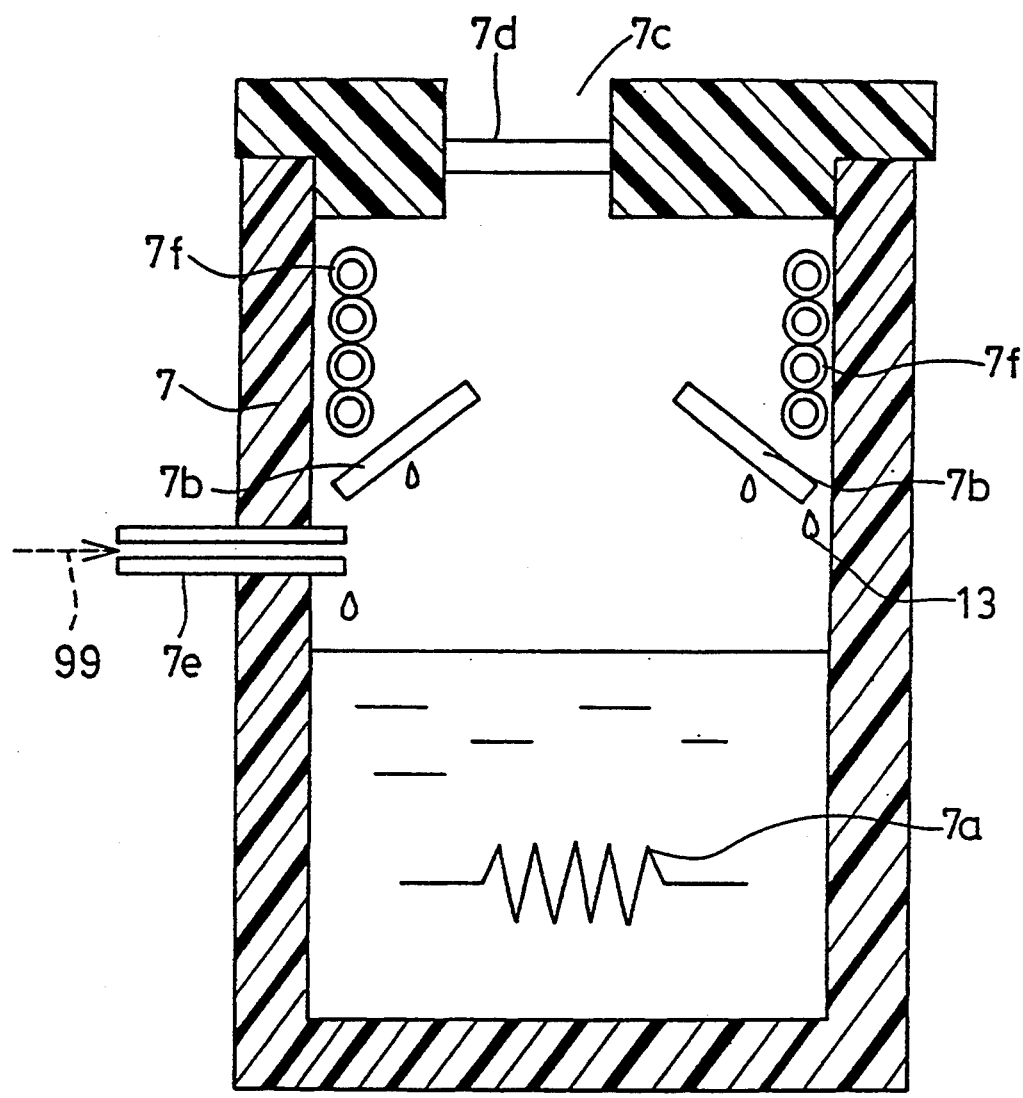
FIG. 16 is a sectional view illustrating a plating solution storage tank included in an electroplating apparatus in accordance with a twelfth embodiment of the present invention.

FIG. 16 is a sectional view illustrating a plating solution storage tank in accordance with a twelfth embodiment of the present invention. In FIG. 16, cooling coils 7f for condensing vapor are disposed on the internal side wall of the tank 7, whereby the internal wall of the tank is always wet and recrystallization of the plating solution due to drying is avoided. Therefore, a relatively unstable plating solution, such as Au sulfite, can be employed with high stability. Further, a water droplet return plate 7b is disposed under the cooling coil 7f. An inert gas, such as $N_2$, is introduced into the tank 7 from a gas inlet 7e as indicated by an arrow 99 so that the space above the plating solution is filled with the inert gas, whereby oxidation of the plating solution is avoided. A vent hole 7c is disposed at the top of the tank 7 to prevent excessive increase in the internal pressure. The vent hole 7c is covered with a GORE-TEX film 7d that prevents the liquid from escaping, whereby the concentration of the plating solution in the tank 7 is kept uniform.

What is claimed is:

1. An electroplating apparatus including:
   a casing in which a substrate is subjected to electroplating, said casing having an opening at the bottom;
   a plating solution injector penetrating through an upper part of said casing through which a plating solution is introduced into said casing;

an exhaust port penetrating through an upper part of said casing through which the plating solution is removed from said casing;

a vertically movable substrate stage disposed beneath said casing on which a substrate may be mounted, said stage having an opening smaller than a substrate; and a spin chuck for carrying a substrate to said substrate stage.

2. An electroplating apparatus comprising:

a casing having a bottom with an opening;

a vertically movable substrate stage on which a substrate having opposite front and rear surfaces and a prescribed diameter is mounted with the front surface upward, said stage being disposed beneath said casing serving as a lid for sealing the opening in the bottom of said casing, and having an opening smaller than the substrate;

a cathode contact mechanism penetrating through a part of said casing and including a cathode contact pin for contacting the front surface of the substrate;

a plating solution injector penetrating through an upper part of said casing through which a plating solution is introduced into said casing;

an anode having a plurality of holes and disposed at an end of said plating solution injector inside of said casing opposite the front surface of the substrate;

a first exhaust port penetrating through an upper part of said casing through which the plating solution is removed from said casing; and a vertically movable spin chuck having a center aligned with a center of said substrate stage, said spin chuck being smaller than the opening of said substrate stage wherein a substrate disposed on the spin chuck is transferred to said substrate stage when said substrate stage moves upward and closes said casing at the opening in the bottom of said casing, the substrate being subjected to electroplating in said casing and, after the electroplating, said substrate stage moving downward and the substrate being transferred to said spin chuck.

3. The electroplating apparatus of claim 2 wherein said spin chuck is united with said substrate stage and a part of said substrate stage on which the substrate is to be mounted is smaller than the substrate.

4. The electroplating apparatus of claim 2 comprising means for balancing internal pressure in said casing with an external pressure, said means for balancing being disposed beneath said substrate stage and having a part capable of expansion and contraction disposed opposite the opening in said substrate stage.

5. The electroplating apparatus of claim 2 comprising:

a second exhaust port penetrating through a part of said substrate stage; and means for introducing an inert gas into said casing so that the inert gas expels the plating solution from said second exhaust port.

6. The electroplating apparatus of claim 5 including a plating solution storage tank connected to said plating solution injector and the second exhaust port, said tank comprising:

a vent hole for preventing an excessive increase in internal pressure within said tank and covered with a film through which gas but not liquid plating solution can pass;

cooling coils for condensing vapor, said cooling coils being disposed on an upper part of an internal side wall of said tank;

a water drop return plate disposed under said cooling coils; and an inlet for introducing an inert gas into said tank.

7. The electroplating apparatus of claim 6 wherein the film is expanded polytetrafluoroethylene.

8. The electroplating apparatus of claim 2 wherein said plating solution injector is vertically movable and including means for controlling distance between said plating solution injector and the substrate.

9. The electroplating apparatus of claim 2 comprising:

a drip-proof plate disposed between said casing and said substrate stage and having a rear surface; and a nozzle for washing the substrate disposed on the rear surface of said drip-proof plate.

10. The electroplating apparatus of claim 2 wherein said cathode contact pin has opposite upper and lower ends and is coated with an insulating film except at the upper and lower ends;

said cathode contract mechanism includes:

a cylindrical cathode pin guide through which said cathode contact pin is guided and supported;

a spring for urging said cathode contact pin vertically; and a chamber enclosing said spring and the upper end of said cathode contact pin; and said apparatus further includes a gas inlet for introducing an inert gas into said chamber and a space between said cathode contact pin and an internal wall of said pin guide.

11. The electroplating apparatus of claim 10 wherein said cathode contact pin and said spring are unitary.

12. The electroplating apparatus of claim 2 including a toroidal cathode contact metal ring interposed between the cathode contact mechanism and the substrate and having a plurality of ridges for contacting the substrate.

13. The electroplating apparatus of claim 2 including a plating solution storage tank connected to said plating solution injector, said tank comprising:

a vent hole for preventing an excessive increase in internal pressure within said tank and covered with a film through which gas but not liquid plating solution can pass;

cooling coils for condensing vapor, said cooling coils being disposed on an upper part of an internal side wall of said tank;

a water drop return plate disposed under said cooling coils; and an inlet for introducing an inert gas into said tank.

14. The electroplating apparatus of claim 13 wherein the film is expanded polytetrafluoroethylene.

15. The electroplating apparatus of claim 2 comprising:

a plurality of electroplating apparatus, each apparatus having a plating solution storage tank and a plating solution circulating means;

a common reserve tank; and valves connecting said respective plating solution storage tanks to said reserve tank.

16. An electroplating method comprising:

circulating a plating solution through a closed circulation path including a plating solution storage tank and a pump while not electroplating;

after washing the inside of a casing with water, introducing an inert gas into the casing and draining the water from the casing through a first exhaust port;
introducing the plating solution into the casing through the circulation path, and electroplating while circulating the plating solution;
after electroplating, introducing an inert gas into the casing and draining the plating solution through a second exhaust port into the storage tank; and
after washing the casing with water, introducing an inert gas into the casing and draining the water through the first exhaust port.

* * * * *